(12) United States Patent
Ikeda

(10) Patent No.: US 7,755,433 B2
(45) Date of Patent: Jul. 13, 2010

(54) PREAMPLIFIER AND OPTICAL RECEIVING DEVICE INCLUDING THE SAME

(75) Inventor: Hitoshi Ikeda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/144,685

(22) Filed: Jun. 24, 2008

(65) Prior Publication Data

US 2009/0002078 A1  Jan. 1, 2009

(30) Foreign Application Priority Data

Jun. 28, 2007  (JP) .............................. 2007-170774

(51) Int. Cl.
*H03F 3/08* (2006.01)
(52) U.S. Cl. .................................. 330/308; 250/214 A
(58) Field of Classification Search ................. 330/308, 330/85, 110, 311; 250/214 A, 214 AG; 398/202, 398/209, 37
See application file for complete search history.

(56) References Cited

U.S. PATENT DOCUMENTS 7,305,190 B2 * 12/2007 Mayampurath et al. ..... 398/202

FOREIGN PATENT DOCUMENTS

| JP | 06-152535 | 5/1994 |
|---|---|---|
| JP | 2006-081141 | 3/2006 |

* cited by examiner

*Primary Examiner*—Robert Pascal
*Assistant Examiner*—Hieu P Nguyen
(74) *Attorney, Agent, or Firm*—Volentine & Whitt, PLLC

(57) ABSTRACT

A preamplifier includes a single-ended amplifier, a differential amplifier, an operational amplifier, and a clipping circuit. The single-ended amplifier converts an input current signal into a voltage signal, outputs an amplified voltage signal according to a preset amplification gain. The differential amplifier includes first and second differential inputs, and outputs a negative-phase signal and a positive-phase signal. The amplified voltage signal is applied to the first differential input of the differential amplifier. The operational amplifier includes first and second inputs which respectively receive the negative-phase signal and the positive-phase signal, where an output of the operational amplifier is applied to the second differential input of the differential amplifier. The clipping circuit clips an amplitude of the negative-phase signal output by the differential amplifier.

16 Claims, 9 Drawing Sheets

PREAMPLIFIER AND OPTICAL RECEIVING DEVICE INCLUDING THE SAME

BACKGROUND OF THE INVENTION

1. Field of the Invention

The present invention generally relates to optical communication systems, and more particularly, the present invention relates to a preamplifier and an optical receiving device that may be utilized in an optical communication system.

2. Description of the Related Art

Figure 12:
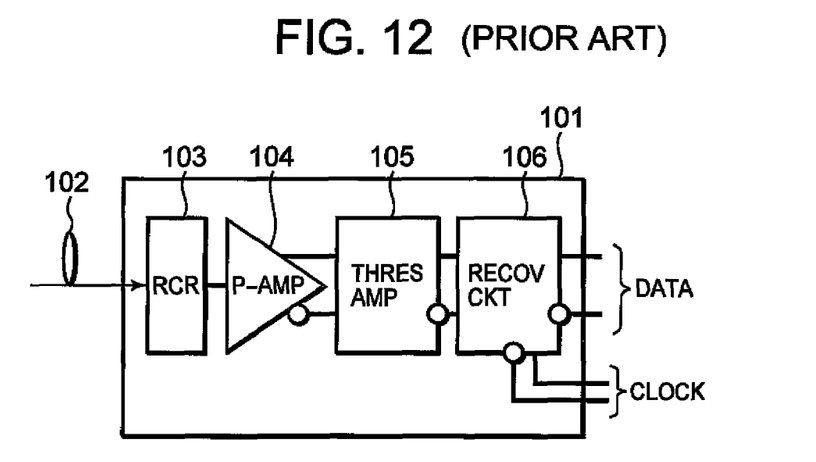
FIG. 12 is a block diagram of a conventional optical receiving device.

FIG. 12 is a block diagram of a conventional optical receiving device 101 coupled to an optical fiber 102. As shown, the optical receiving device 101 includes a light receiving element 103, a preamplifier 104, a threshold setting limiter amplification circuit 105, and a clock/data identification recovery circuit 106.

The light receiving element (RCR) 103 converts an optical signal transmitted from the optical fiber 102 into an current signal. The light receiving element 103 may be implemented, for example, by a positive intrinsic negative-photo diode (PIN-PD) or an avalanche photo diode (APD).

The preamplifier (P-AMP) 104 converts the current signal output from the light receiving element 103 into a voltage signal, and amplifies the voltage signal. The preamplifier 104 may be implemented, for example, by a trans-impedance amplifier (TIA).

The threshold setting limiter amplification circuit (THRES AMP) 105 compares the voltage signal output from the preamplifier 104 with a preset threshold voltage to thereby generate an output signal corresponding to logic "1" (high level) or logic "0" (low level). The logic "1" and "0" voltage amplitudes of the output signal are independent of the power-level of the received optical signal. The threshold setting limiter amplification circuit 105 may be implemented, for example, by a limiting amplifier (LA).

The clock/data identification recovery circuit (RECOV CKT) 106 functions to recover a clock signal (CLOCK) and a data signal (DATA) synchronized with the clock signal from the signal output from the threshold setting limiter amplification circuit 105. The clock/data identification recovery circuit 106 may be implemented, for example, by a clock and data recovery (CDR) circuit.

Although not shown, one or more optical amplifiers (for example, an Erbium doped fiber amplifier (EDFA)) may be interposed in the input optical transmission path, i.e., between an optical transmitting device (also not shown) and the optical receiving device 101.

Figures 13A, 13B:
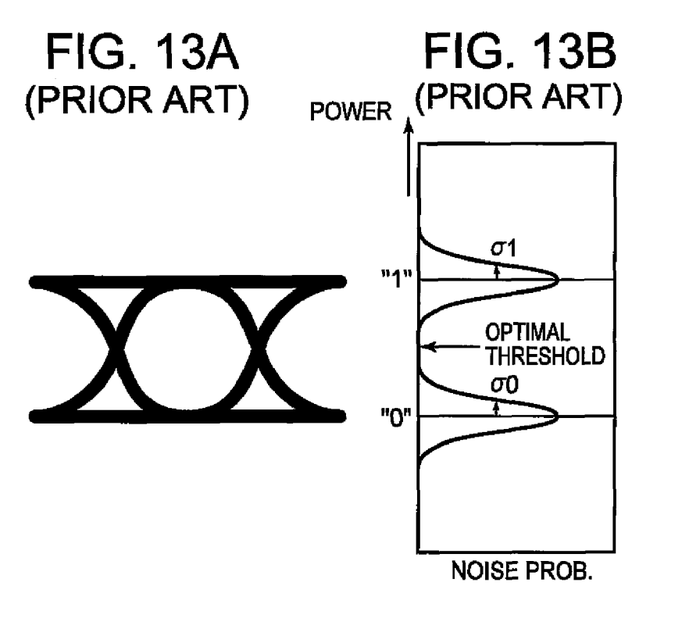
FIG. 13A is a waveform diagram of a non-amplified optical signal inputted to the optical receiving device of FIG. 12.
FIG. 13B is a graph illustrating a statistical noise probability distribution of the optical signal of FIG. 13A.

FIG. 13A is a waveform diagram (eye pattern) of a non-amplified optical signal inputted to the optical receiving device 101 (i.e., in the simplified case where an optical amplifier has not been implemented in the optical transmission path). FIG. 13B is a graph illustrating a statistical noise probability distribution of logic "1" (high level) and logic "0" (low level) of the optical signal of FIG. 13A.

In FIG. 13B, where the vertical axis denotes optical power, standard deviations $\sigma 1$ and $\sigma 0$ of the noise probability distribution of logic "1" and "0" are approximately equal to each other. As such, an optimal threshold level for distinguishing between logic "1" and logic "0" lies halfway between center values of logic "1" and "0," that is, at a level of 50% power (where the logic "0" level is at 0%, and the logic "1" level is at 100%).

When the optical signal of FIG. 13A is input to the optical receiving device 101, the optical signal is first converted into a current signal in the light receiving element 103. The current signal is converted into a voltage signal in the preamplifier 104 from which a linearly amplified electrical signal is output if the current signal has a small amplitude. On the other hand, if the current signal has a large amplitude, a saturated electrical signal is outputted from the preamplifier 104. In either case, the optimal threshold at an output of the preamplifier 104 is located a middle level between logic "1" and "0," that is, a center value of the output amplitude.

The threshold setting limiter amplification circuit 105, which receives the output signal from the preamplifier 104, sets a threshold with an absolute value level of an amplitude of an output voltage of the preamplifier 104. Typically, the preamplifier 104 is capacitively-coupled to the threshold setting limiter amplification circuit 105. If the optimal threshold is a center value of the input amplitude, a threshold set in the threshold setting limiter amplification circuit 105 becomes about 0 mV and is independent of the output amplitude of the preamplifier 104.

Figures 14A, 14B:
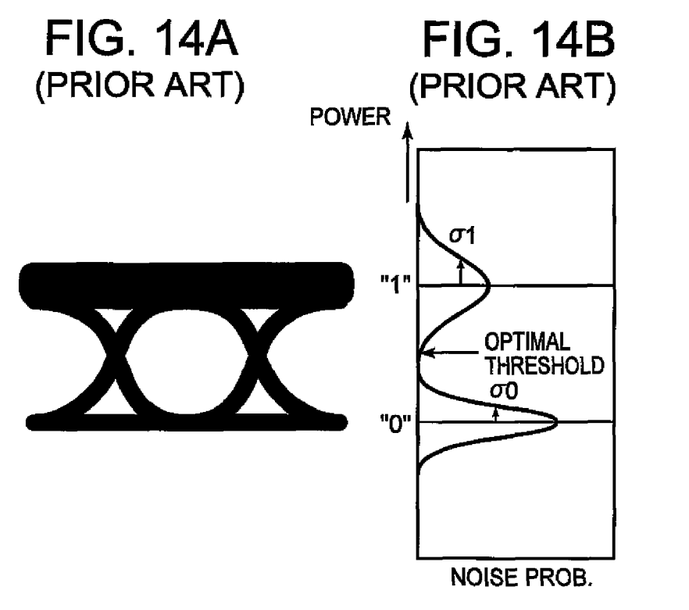
FIG. 14A is a waveform diagram of an amplified optical signal inputted to the optical receiving device of FIG. 12.
FIG. 14B is a graph illustrating a statistical noise probability distribution of the optical signal of FIG. 14A.

FIG. 14A is a waveform diagram (eye pattern) of an amplified optical signal inputted to the optical receiving device 101 (i.e., in the case where an optical amplifier has been implemented in the optical transmission path). FIG. 14B is a graph illustrating a statistical noise probability distribution of logic "1" (high level) and logic "0" (low level) of the optical signal of FIG. 14A.

As shown in FIG. 14B, a standard deviation $\sigma 1$ of the noise probability distribution of logic "1" is larger than a standard deviation $\sigma 0$ of the noise probability distribution of logic "0". This is due to spontaneous emission of noise proportional to optical power by the optical amplifier. Since a noise distribution (variance) of logic "1" is larger than the noise distribution of logic "0," an optimal threshold level for distinguishing between logic "1" and logic "0" is biased towards logic "0."

When the optical signal of FIG. 14A is input to the optical receiving device 101, the input optical signal is ultimately converted into an amplified voltage signal, as described above. However, if the preamplifier 104 executes an ideal linear operation (equivalent amplification), an optimal threshold for an output waveform of the preamplifier 104 is constant when expressed by a percentage (with a logic "0" level as 0% and a logic "1" level as 100%) independent of received optical power. However, the optimal threshold is proportional to average power of an input optical signal when it is expressed by an absolute value of an amplitude of an output voltage.

The threshold set in the threshold setting limiter amplification circuit 105 has an absolute value level as described above. For example, if the threshold is 40% (when expressed by a percentage with a logic "0" level as 0% and a logic "1" level as 100%), the threshold set in the threshold setting limiter amplification circuit 105 becomes −10 mV if single phase output amplitude of the preamplifier 104 is 100 mV, and becomes −20 mV if this amplitude is 200 mV.

Figure 15:
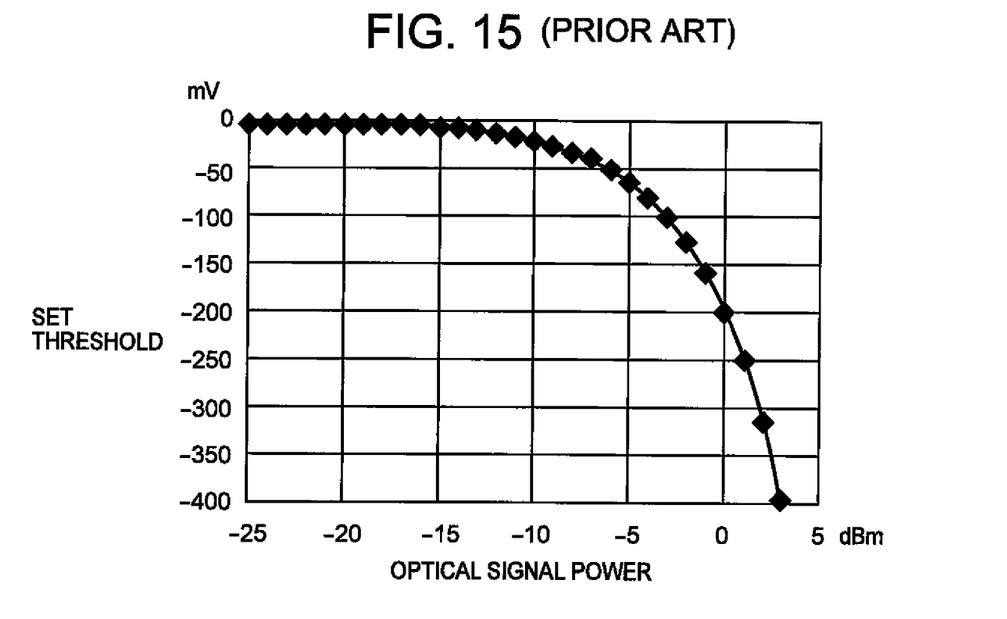
FIG. 15 is a graphical view showing a relationship between a set threshold of a conventional threshold setting limiter amplification circuit and an optical signal power.
Figure 16:
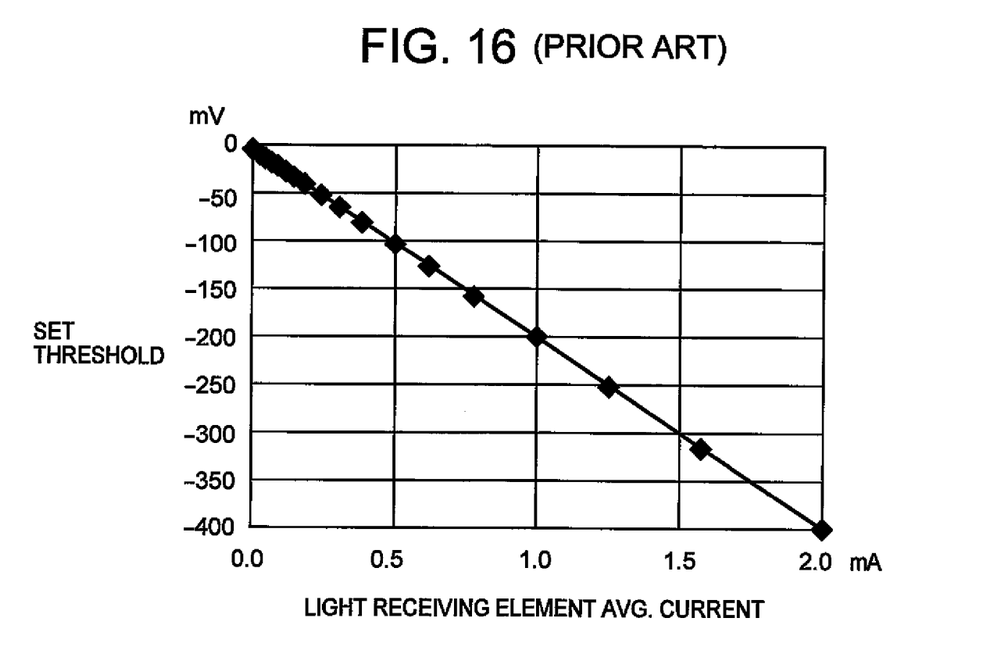
FIG. 16 is a graphical view showing a relationship between a set threshold of a conventional threshold setting limiter amplification circuit and an average current of a light receiving element.

If the threshold is 40% (by percentage) and a gain (trans impedance gain) of the preamplifier 104 is 1 KΩ, the relationship between the threshold set in the threshold setting limiter amplification circuit 105 and the power of the optical signal is shown in FIG. 15. Also, the relationship between the threshold-set in the threshold setting limiter amplification circuit 105 and average current of the light receiving element 103 is shown in FIG. 16. It can be seen from FIG. 16 that the threshold set in the threshold setting limiter amplification circuit 105 is proportional to the average current of the light receiving element 103.

Since the threshold to be set in the threshold setting limiter amplification circuit 105 is proportional to the average current of the light receiving element 103, the optical receiving device 101 generally employs a type of feedback control. In the feedback control, a threshold is determined in accordance with the current flowing through the light receiving element 103 and is set in the threshold setting limiter amplification circuit 105.

In such an optical communication system, in the case where a PIN-PD is used as the light receiving element to realize a transmission rate of 10 Gbps, power of an input optical signal required for the optical receiving device 101 is −20 dBm to +1 dBm, and its dynamic range is 42 dB (125 times) in terms of voltage. In addition, when the optical amplifier is used, the power of the input optical signal required for the optical receiving device 101 exhibits a characteristic in which a penalty due to noises included in the optical signal (an external factor to narrow a dynamic range of the power of the input optical signal, which is not originated from the optical receiving device) is deducted from the requirement.

In addition, since input sensitivity of a limiting amplifier used as the threshold setting limiter amplification circuit 105 is commonly 10 mVpp in single phase and the preamplifier 104 requires output amplitude of 20 mVpp in single phase in order to cause the clock/data identification recovery circuit 106 to identify clocks or data without any error, the preamplifier 104 requires a gain of 1 KΩ or so.

However, when an optical signal of +1 dBm is input to the preamplifier 104 that performs a linear operation (equivalent amplification) and has the gain of about 1 KΩ, since the preamplifier 104 has output amplitude of about 2.5 Vpp in single phase, there arises a problem in that a typical limiting amplifier has amplitude exceeding a rating.

To overcome this problem, a preamplifier has been developed which is equipped with an automatic gain control (AGC) function to automatically lower a gain of the preamplifier when a large optical signal is inputted thereto.

In addition, there has been proposed a technique in which a filter is provided to adjust an electrical signal, which is amplified by the preamplifier 104 in order to increase reception sensitivity in long distance transmission, to a variable pass band. For example, reference is made to Japanese Patent Application Publication No. 2006-81141 (JP '141), esp. paragraphs [0023] to [0030] and FIGS. 1 and 2 thereof.

In addition, there has been proposed a technique in which an output of a preamplifier is clamped to a constant voltage in order to respond to a sudden change of received optical power. For example, reference is made to Japanese Patent Application Publication No. Hei6-152535 (JP '535), especially paragraphs [0013] to [0016] and FIG. 1 thereof.

Figure 17:
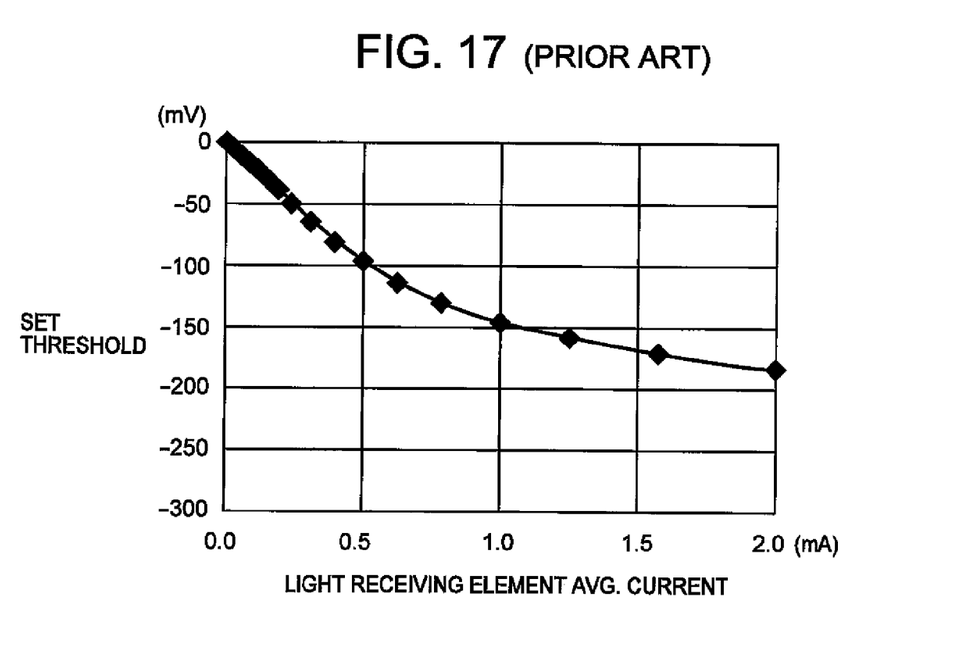
FIG. 17 is a graphical view showing a relationship between a set threshold of a threshold setting limiter amplification circuit and an average current of a light receiving element when a preamplifier equipped with an AGC function is utilized.

FIG. 17 shows a relationship between a threshold set in the threshold setting limiter amplification circuit 105 and an average current of the light receiving element 103 when the preamplifier 104 equipped with the above-mentioned conventional automatic gain control function. In FIG. 17, it is assumed that a threshold of an input optical waveform is 40*t* by percentage and a gain of the preamplifier 104 when a small signal is inputted thereto is 1 KΩ.

Although the optical receiving device 101 using the preamplifier 104 equipped with an automatic gain control function can attain a favorable error characteristic, since a range of the set threshold of the threshold setting limiter amplification circuit 105, which is proportional to a current of the light receiving element 103, and a current range of the light receiving element 103 at which the automatic gain control function begins to operate are varied with change of IC power or operation temperature, as shown in FIG. 17, or it is difficult to control the set threshold in an range of automatic gain control operation, there arises a problem in that a programmable control IC or the like has to be used for a peripheral circuit, thereby necessitating difficult threshold control.

In addition, the technique of JP '141 suffers a drawback in that it requires a filter having a variable capacitance diode and a voltage controllable circuit to control a voltage applied to the variable capacitance diode. Thus, the control and circuitry are relatively complex.

In addition, the technique of JP '535 has a disadvantage in that it can not attain good identification recovery of a signal since a low level and a high level of an output waveform are clipped so as to output a waveform having vertically-symmetrical constant amplitude.

SUMMARY OF THE INVENTION

According to an aspect of the present invention, preamplifier includes a single-ended amplifier, a differential amplifier, an operational amplifier, and a clipping circuit. The single-ended amplifier converts an input current signal into a voltage signal, outputs an amplified voltage signal according to a preset amplification gain. The differential amplifier includes first and second differential inputs, and outputs a negative-phase signal and a positive-phase signal. The amplified voltage signal is applied to the first differential input of the differential amplifier. The operational amplifier includes first and second inputs which respectively receive the negative-phase signal and the positive-phase signal, where an output of the operational amplifier is applied to the second differential input of the differential amplifier. The clipping circuit clips an amplitude of the negative-phase signal output by the differential amplifier.

According to another aspect of the present invention, optical receiving device is provided which includes a light receiving element that converts a received optical signal into a current signal, and a preamplifier that converts the current signal outputted from the light receiving element into an amplified output voltage signal. The preamplifier includes a single-ended amplifier, a differential amplifier, an operational amplifier, and a clipping circuit. The single-ended amplifier converts an input current signal into a voltage signal, outputs an amplified voltage signal according to a preset amplification gain. The differential amplifier includes first and second differential inputs, and outputs a negative-phase signal and a positive-phase signal. The amplified voltage signal is applied to the first differential input of the differential amplifier. The operational amplifier includes first and second inputs which respectively receive the negative-phase signal and the positive-phase signal, where an output of the operational amplifier is applied to the second differential input of the differential amplifier. The clipping circuit clips an amplitude of the negative-phase signal output by the differential amplifier.

BRIEF DESCRIPTION OF THE DRAWINGS

The above and other aspects and features of embodiments of the present invention will become readily apparent from the detailed description that follows, with reference to the accompanying drawings, in which.

DETAILED DESCRIPTION OF EMBODIMENTS

The present invention will now be described by way of preferred, but non-limiting, embodiments of the invention. It should be noted that the invention may be implemented in various ways which differ from the preferred embodiments without departing from the spirit and scope of the invention.

Also, when a component or element is described as being "connected to" another component or element, it is understood that intervening elements may be present which do not substantially impact functionality. The exception to this is if a component or element is described as being "directly connected" to another device or component. Likewise, if a component or element is described as "receiving" a signal or signals from another device or component, intervening components or elements may be present so long as the information content or voltage characteristics of the signal or signals is not substantially altered.

In the embodiments that follow, a GaAs/AlGaAs type HEMT (High Electron Mobility Transistor) may, for example, be utilized as a FET (Field Effect Transistor).

Figure 1:
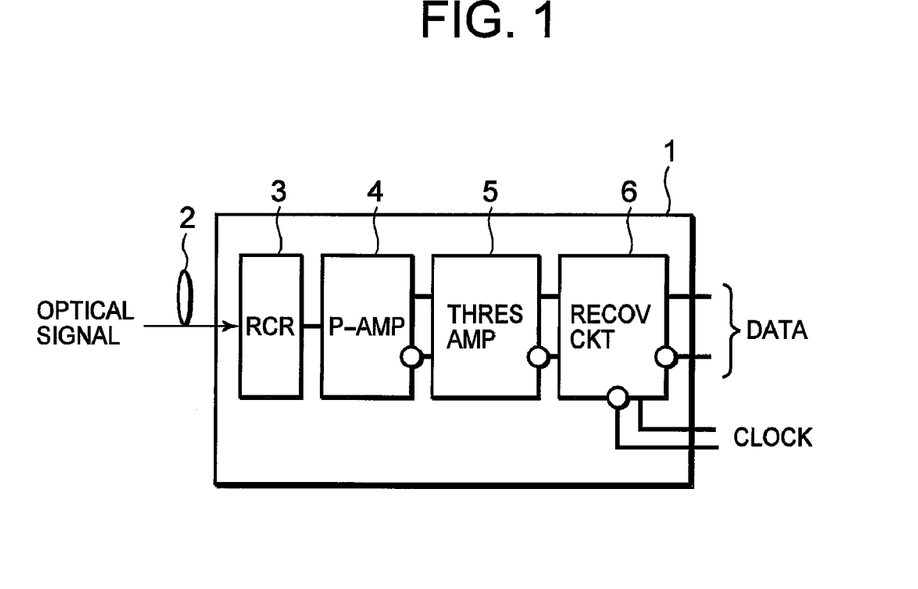
FIG. 1 is a block diagram of an optical receiving device according to an embodiment of the present invention.

FIG. 1 is a block diagram of an optical receiving device according to an embodiment of the present invention.

In FIG. 1, the optical-receiving device 1 includes a light receiving element (RCR) 3, a preamplifier 4 (P-AMP), a threshold setting limiter amplification circuit 5 (THRES AMP), and a clock/data identification recovery circuit 6 (RE-COV CKT).

The light receiving element 3 converts a light signal received from an optical fiber 2 into a current signal, and may be implemented, for example, by a positive intrinsic negative-photo diode (PIN-PD) or an avalanche photo diode (APD).

The preamplifier 4 converts the current signal output from the light receiving element 3 into a voltage signal and amplifies the voltage signal. The preamplifier 4 may be implemented, for example, by a trans-impedance amplifier (TIA).

The threshold setting limiter amplification circuit 5 determines whether the voltage signal output from the preamplifier 4 is "1" (high level) or "0" (low level) based on a preset threshold, and outputs a corresponding constant amplitude signal which is independent of the power of the received light. The threshold setting limiter amplification circuit 5 may be implemented, for example, by a limiting amplifier (LA).

The clock/data identification recovery circuit 6 recovers a clock signal and a data signal synchronized with the clock signal from a signal output from the threshold setting limiter amplification circuit 5, and may be implemented, for example, by a clock and data recovery (CDR) circuit.

An optical amplifier (for example, an Erbium doped fiber amplifier (EDFA)) (not shown) may be interposed between an optical transmitting device (not shown) and the optical receiving device 1.

The preamplifier 4 according to an embodiment of the present invention will be described now with reference to FIG. 2.

Figure 2:
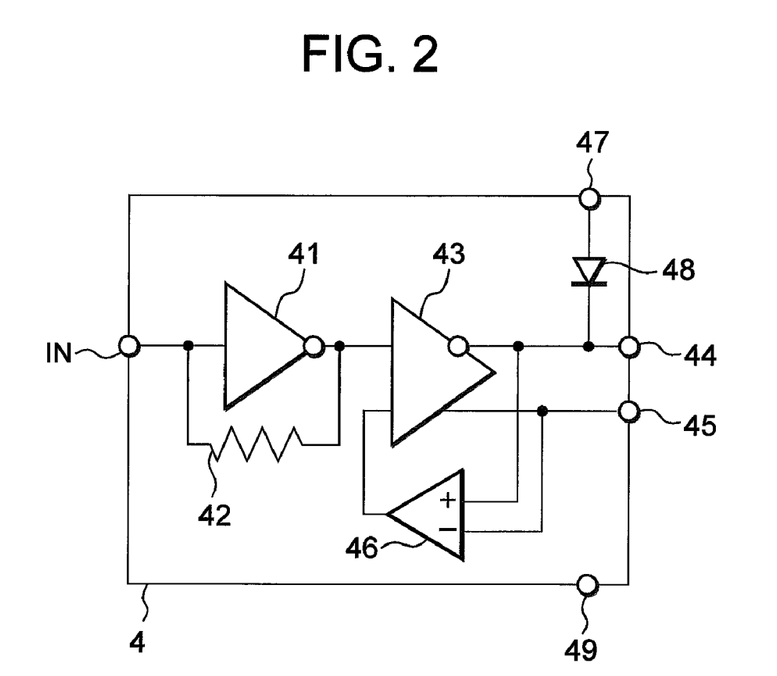
FIG. 2 is a block diagram of a preamplifier according to an embodiment of the present invention.

Referring to FIG. 2, the preamplifier 4 of this example includes a single-ended Amp 41, and a feedback resistor 42 connected in parallel to the single-ended Amp 41. The single-ended Amp 41 and feedback resistor 42 convert the current signal from the light receiving element into a voltage signal and amplify the voltage signal with a predetermined gain.

The preamplifier 4 further includes a differential Amp 43 and an operational Amp 46 connected in such a manner that the operational Amp 46 is inputted with a negative-phase signal 44 and a positive-phase signal 45 output by the differential Amp 43, and an output of the operational Amp 46 is fed-back to one input of the differential Amp 43. The operational Amp 46 is inputted with the output from the single-ended Amp 41 and the output from the operational Amp 46.

Additionally, the preamplifier 4 of this example includes a diode 48 provided between the negative-phase output 44 and a positive power terminal 47, where an anode of the diode 48 connected to the positive power terminal 47. Reference number 49 of the figure denotes a negative power terminal. The connection location of the diode 48 is not limited, and may instead be located anywhere a main signal is inverted (i.e., has a negative logic level). Preferably, the diode 48 is located near the output portion in order to clip a "1" level if a large signal is input.

Figure 3:
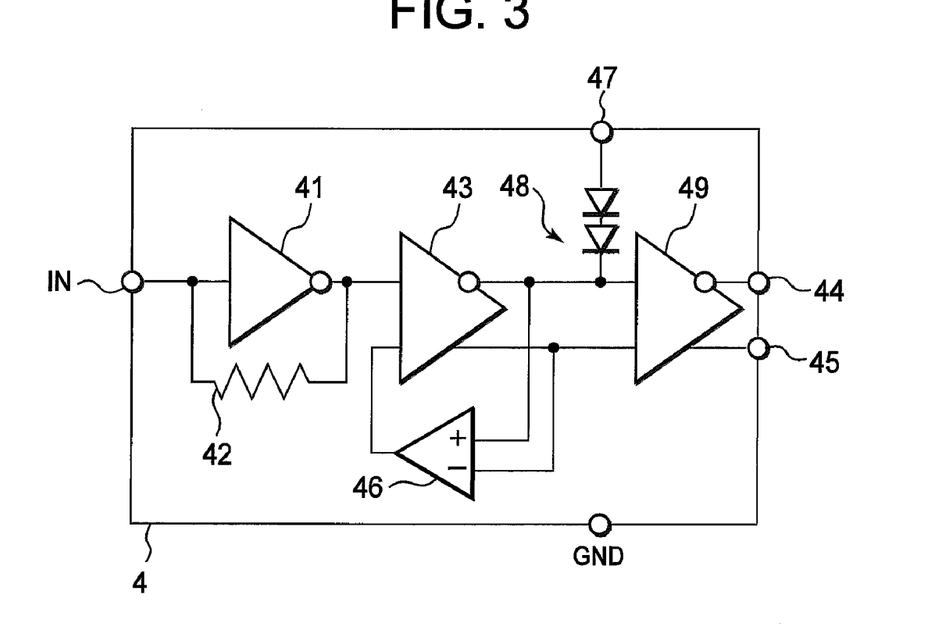
FIG. 3 is a block diagram of a preamplifier according to another embodiment of the present invention.

FIG. 3 is a block diagram showing the configuration of the preamplifier 4 according to another embodiment of the present invention.

As shown in FIG. 3, the preamplifier 4 of this example a single-ended Amp 41, a differential Amp 43, and an output buffer differential Amp 49 which outputs a signal with an output impedance of 50 ΩL, for example. In this embodiment, ground (GND) is used as a negative power source and +3.3 V is used as a positive power source 47. The remaining reference numbers denote like element in previously described FIG. 2.

Diodes 48 with their anodes connected to a positive power terminal 47 are provided as a two-stage clipping circuit connected between the negative-phase output of the differential amplifier 43 and the positive power source 47. The diodes 48 are located in the circuit before the negative-phase output 44 so as to prevent an output impedance from deviating from 50 ΩL. This is because the impedance of the diodes 48 becomes relatively low when current begins to flow through the diodes 48 when a large optical signal is input.

In the example of this embodiment, two stages of diodes 48 are connected in series so as to effectively clip the amplitude of a "1" level when a high power optical signal is received.

It is noted there that the diodes 48 have little or no operational impact in the event a relatively low power optical signal is received. On the other hand, the clipping functionality is realized when a high power optical signal is received.

Figure 4:
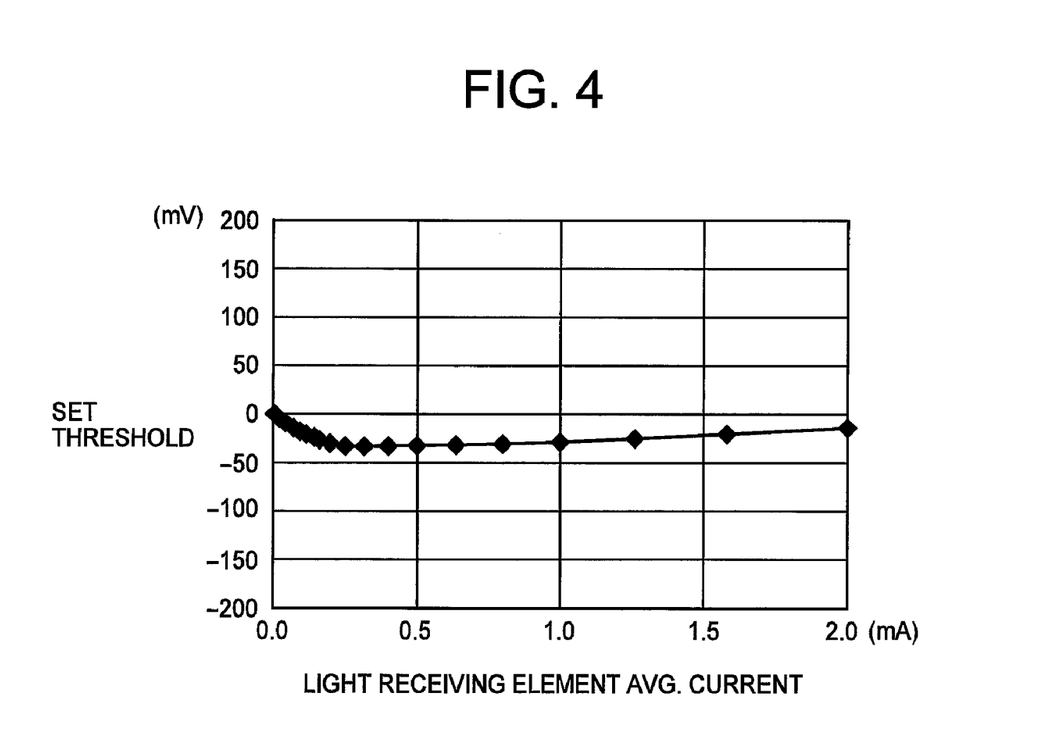
FIG. 4 graphically illustrates a relationship between a set threshold of a threshold setting limiter amplification circuit and an average current of a light receiving element according to an embodiment of the present invention.

FIG. 4 shows a light receiving element average current dependency of a set threshold of the threshold setting limiter amplification circuit 5 according to the this embodiment. When this embodiment is applied, it can be seen that a change of the set threshold is ±20 mV or so in a range of light receiving element average current up to 1.25 mA required as a dynamic range, which is very small as compared to when the diodes 48 are not present (see FIG. 16).

In addition, considering a change of power supplied to the preamplifier 4, since a current source is provided at a negative power side in the circuit and a potential of a path through which a main signal is amplified and transmitted follows a positive power side for the power change, clipping of the amplitude of "1' level for the power change has favorable stability.

As described above, this embodiment offers an advantage in that favorable signal identification recovery can be attained as the threshold of −20 mV or so is always set in the threshold setting limiter amplification circuit 5 without requiring a feedback control to set the threshold in the threshold setting limiter amplification circuit 5 depending on input optical power by providing the diode 48 with the anode connected between the negative-phase output 44 and the positive power terminal 47 of the optical receiving device 1.

In addition, this embodiment has another advantage in that favorable signal identification recovery can be attained as the amplitude is clipped even if power supplied to the preamplifier is changed.

Next, a preamplifier 4 according to other embodiments of the present invention will be described with reference to FIG. 5 and FIG. 6. In these figures, like or similar components as in the previous embodiments are denoted by the same reference numerals, and explanation thereof is omitted below to avoid redundancy.

Figure 5:
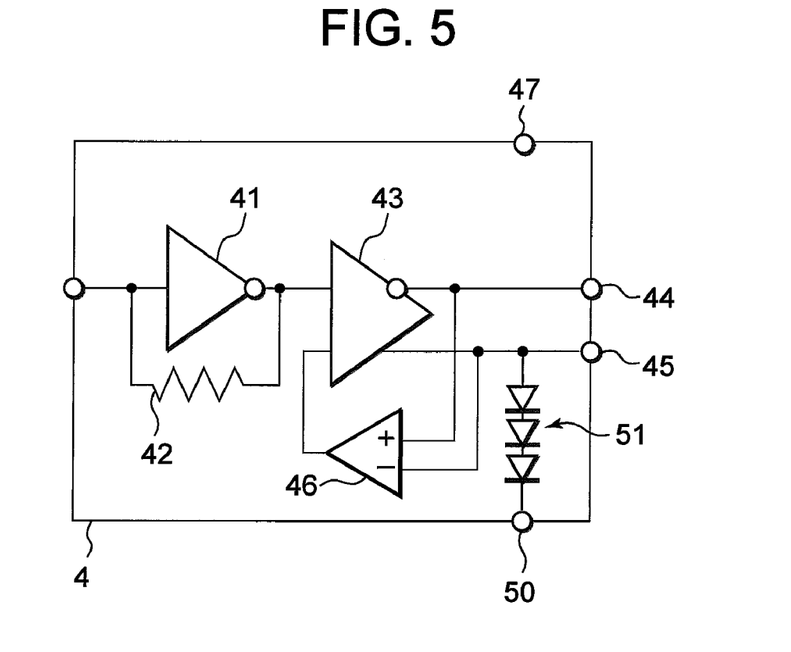
FIG. 5 is a block diagram of a preamplifier according to another embodiment of the present invention.

The configuration of FIG. 5 is the same as that of FIG. 2, except that the clipping circuit is implemented by three-stage diodes 51 connected between positive-phase output 45 and the negative power terminal 50. As shown, the cathodes of the three-stage diodes 51 are connected to negative power terminal 50.

The connection of the diodes 51 is not limited to the output portion as described previously in connection with the earlier embodiments. The diodes 51 may be located anywhere in the preamplifier 4 in which a main signal has a positive logic level so as to realize clipping of the "1" when a large input optical signal is received.

Figure 6:
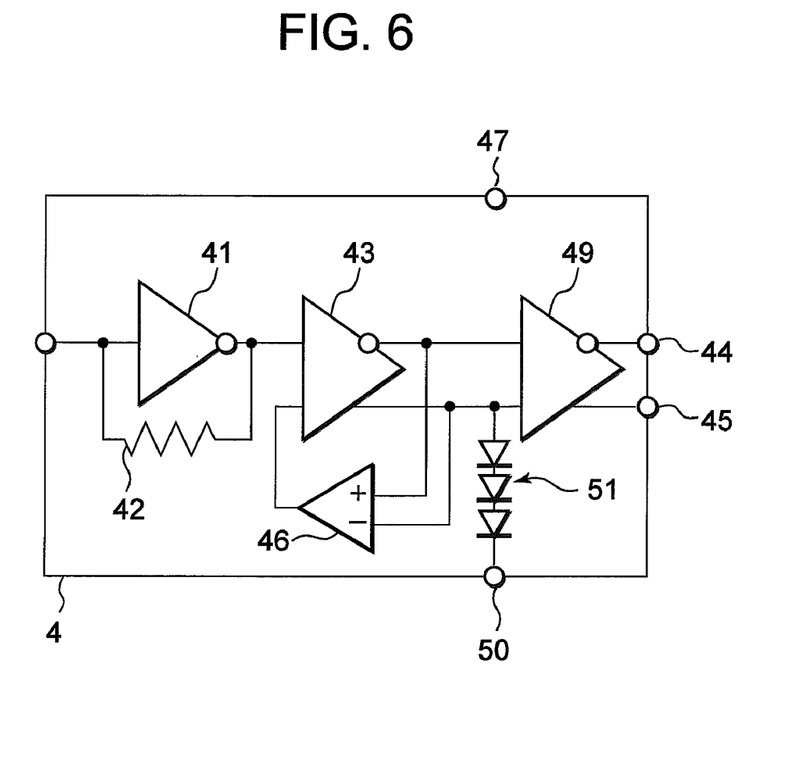
FIG. 6 is a block diagram of a preamplifier according to another embodiment of the present invention.

In the embodiment of FIG. 6, further includes an output buffer differential Amp 49 with an output impedance of 50Ω, for example. In this embodiment, a ground is used as a negative power source and +3.3 V is used as a positive power source.

In FIG. 6, two-stage diodes 51 are connected between the negative power terminal 50 and a positive-phase output of the differential amplifier 43.

Figure 7:
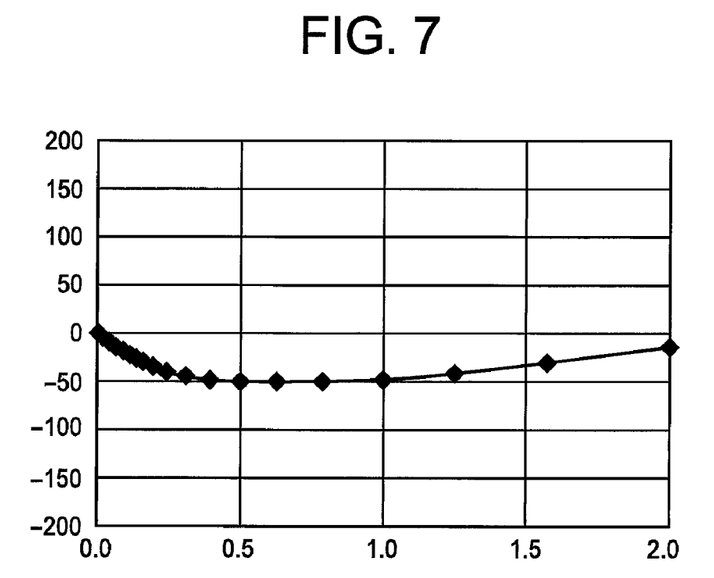
FIG. 7 graphically illustrates a relationship between a set threshold of a threshold setting limiter amplification circuit and an average current of a light receiving element according to another embodiment of the present invention.

FIG. 7 shows a light receiving element average current dependency of a set threshold of the threshold setting limiter amplification circuit 5 according to the embodiment of FIG. 6. When this embodiment is applied, it can be seen that change of the set threshold is ±25 mV or so in a range of light receiving element average current up to 1.25 mA required as a dynamic range, which is very small as compared to when the diodes 51 are not present (see FIG. 16).

In addition, in comparison with the embodiment of FIG. 3, the change of the set threshold is slightly worse. It is thought that the same result as the embodiment FIG. 3 can be attained by adjusting the number of stages or junction area of diodes.

As described above, the embodiment of FIG. 6 has an advantage in that good signal identification recovery can be attained as the threshold of −25 mV or so is always set in the threshold setting limiter amplification circuit 5 without requiring a feedback control to set the threshold in the threshold setting limiter amplification circuit 5 depending on input optical power by providing the diodes 51 with the anodes connected to the negative power terminal 50 between the positive-phase output 45 and the negative power terminal 50 of the optical receiving device 1.

Next, a preamplifier 4 according to another embodiment of the present invention will be described with reference to FIG. 8. In this figure, like or similar components as in the previous embodiments are denoted by the same reference numerals, and explanation thereof is omitted below to avoid redundancy.

Figure 8:
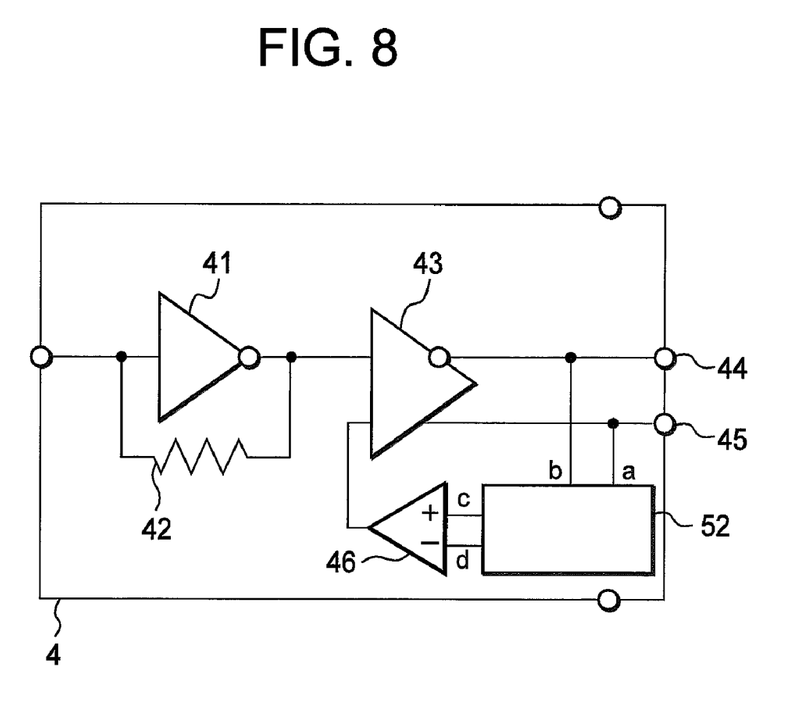
FIG. 8 is a block diagram of a preamplifier according to another embodiment of the present invention.

The preamplifier 4 of the example of FIG. 8 is characterized by the clipping circuit being implemented by an output offset generating circuit 52 provided both of the negative-phase and positive-phase outputs 44 and 55 of the differential Amp 43 and an input of the operational Amp 46.

Like the previous embodiments, the connection portion of the output offset generating circuit 52 is not limited to the output portion, and may instead be located anywhere in which voltages of both of negative-phase and positive-phase outputs 44 and 55 can be offset. For example, similar to FIGS. 3 and 6, the output offset generating circuit 52 may be located prior to an output buffer.

The offset of an output is set such that a positive-phase output voltage is higher than a negative-phase output voltage.

Figure 9:
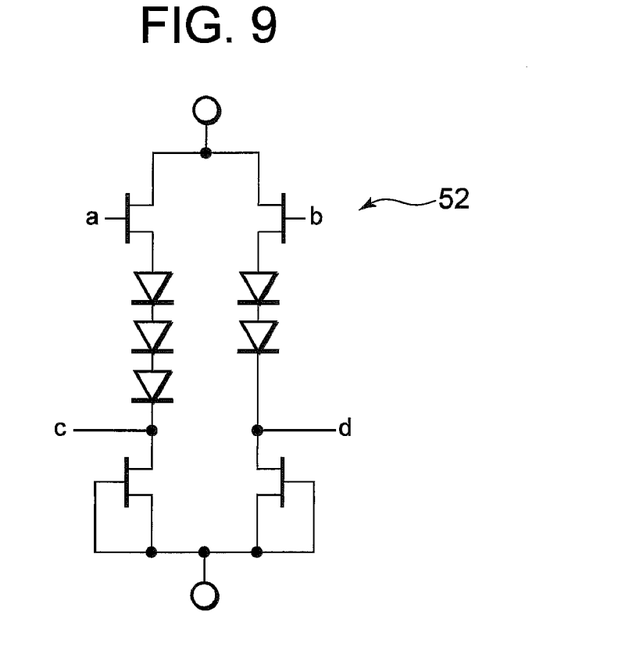
FIG. 9 is a block diagram of an offset generating circuit according to an embodiment of the present invention.

FIG. 9 shows one example of the output offset generating circuit 52. This circuit is configured such that a positive-phase side is asymmetrical with a negative-phase side. That is, the number of stages of diodes at the positive-phase side may be different than the number of stages of diodes at the negative-phase side such that the positive-phase output voltage is higher than the negative-phase output voltage.

More particularly, the circuit shown in FIG. 9 is composed of a first component including a first FET inputted with a signal a from a positive-phase output and having a control electrode connected to a terminal of the positive-phase output, three diodes, and a second FET having a control electrode connected to a negative power terminal, which are connected in series between a positive power terminal and the negative power terminal, and a second component being arranged in parallel to the first component and including a third FET inputted with a signal b from a negative-phase output and having a control electrode connected to a terminal of the negative-phase output, two diodes, and a fourth FET having a control electrode connected to the negative power terminal, which are connected in series between the positive power terminal and the negative power terminal. As outputs of the output offset generating circuit shown in FIG. 9, a signal c is a signal at a portion between the diodes and the second FET in the first component and a signal d is a signal at a portion between the diodes and the fourth FET in the second component.

Figure 10:
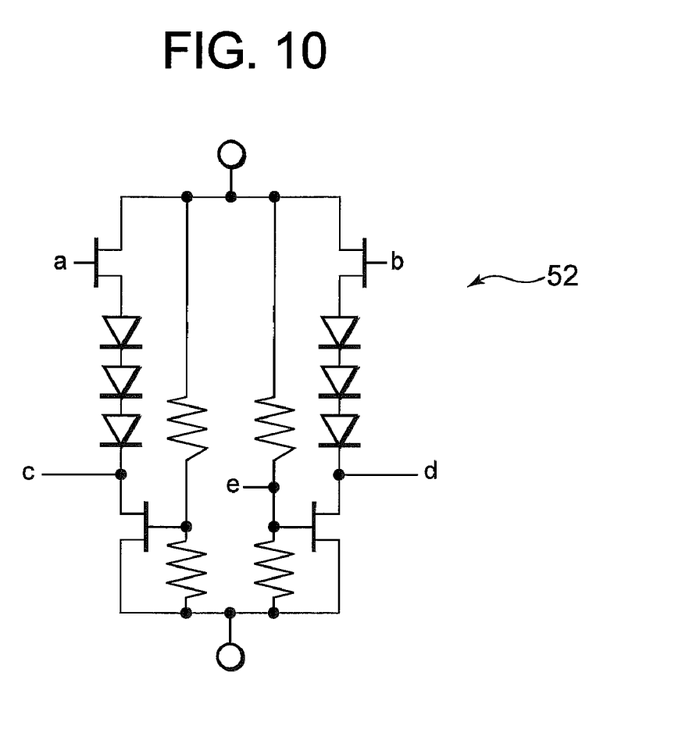
FIG. 10 is a block diagram of an offset generating circuit according to another embodiment of the present invention.

FIG. 10 shows another example of the output offset generating circuit 52. Here, the circuit is configured such that a voltage dividing resistance at the positive-phase side is different than a voltage dividing resistance at the negative-phase side. In addition, the positive-phase output voltage may be offset by applying an external voltage to a terminal "e" shown in FIG. 10.

More particularly, the circuit shown in FIG. 10 is composed of a first component including a first FET inputted with a signal a from a positive-phase output and having a control electrode connected to a terminal of the positive-phase output, three diodes, and a second FET having a control electrode applied with a voltage divided by two resistors connected in series between a positive power terminal and a negative power terminal, and a second component being arranged in parallel to the first component and including a third FET inputted with a signal b from a negative-phase output and having a control electrode connected to a terminal of the negative-phase output, three diodes, and a fourth FET having a control electrode applied with a voltage divided by two resistors (different from the two resistors in the first component) connected in series between the positive power terminal and the negative power terminal. As outputs of the output offset generating circuit shown in FIG. 10, a signal c is a signal at a portion between the diodes and the second FET in the first component and a signal d is a signal at a portion between the diodes and the fourth FET in the second component. The terminal e is connected between the two resistors in the second component.

When an optical signal with small power is inputted to the preamplifier 4 as constructed above, the preamplifier 4 outputs the same electrical waveform as the inputted optical waveform. On the other hand, when an optical signal with large power is inputted to the preamplifier 4, the preamplifier 4 clips amplitude of a "1" level carried with a noise occurring due to the optical amplifier by a positive power voltage depending on a degree of amplitude.

Figure 11:
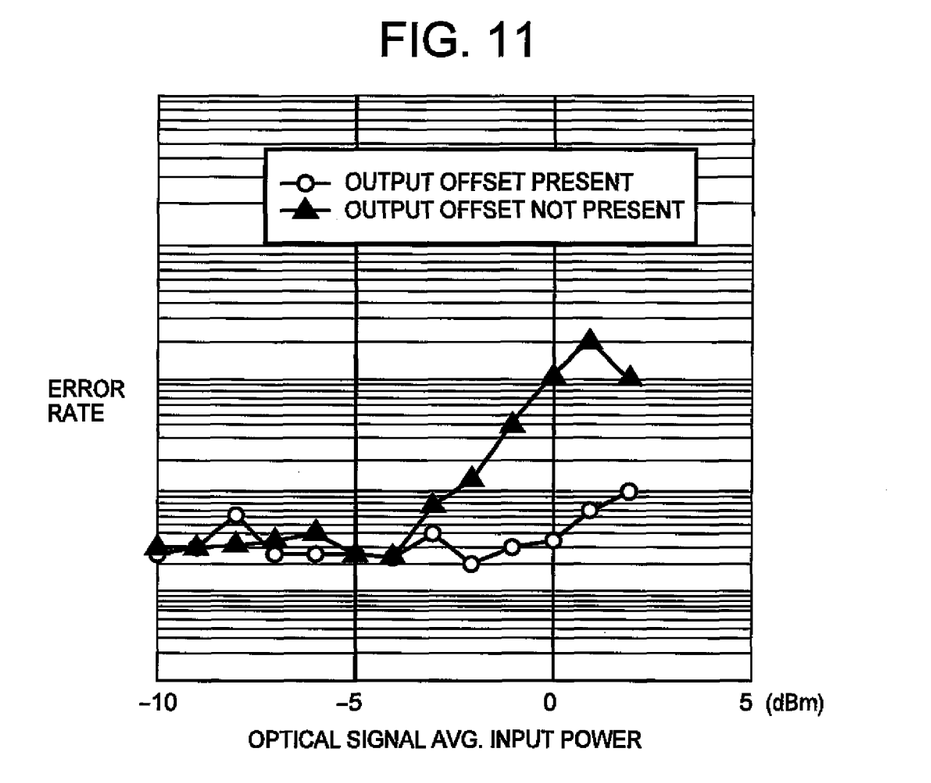
FIG. 11 is a graphical view for use in explaining an error characteristic of a preamplifier according to an embodiment of the present invention.

FIG. 11 shows the effect when the preamplifier 4 employs the output offset generating circuit 52 shown in FIG. 10 and offsets the positive-phase output voltage and the negative-phase output voltage such that the positive-phase output voltage is higher than the negative-phase output voltage by applying a specified voltage to the terminal e drawn out of the preamplifier as shown in FIG. 10.

FIG. 11 is also an explanatory view of an error characteristic of the preamplifier according to the third embodiment, showing an error rate measured in a state where an offset difference is set to be 250 mV by applying the specified voltage to the terminal e shown in FIG. 10 and a state of no offset of 0 mV.

For the measurement, the set threshold of the threshold setting limiter amplification circuit 5 is fixed to −10 mV, a bit rate is set to 10 Gbps, and an OSNR (Optical Signal to Noise Ratio) is set to be 15 dB using the optical amplifier.

As shown in FIG. 11, although there is quite a small error characteristic difference depending on the presence of output offset at the time of input of a small signal, since there is a large error characteristic difference depending on the presence of output offset at the time of input of a large signal, a favorable characteristic is attained even when the set threshold of the threshold setting limiter amplification circuit 5 is fixed with no reference to input optical power.

As described above, the embodiment of FIG. 8 has an advantage that favorable signal identification recovery can be attained as the fixed threshold is set in the threshold setting limiter amplification circuit 5 without requiring a feedback control to set the threshold in the threshold setting limiter amplification circuit 5 depending on input optical power by employing the output offset generating circuit 52 and offsetting the outputs of the circuit 52 such that the positive-phase output voltage is higher than the negative-phase output voltage.

The present invention addresses a technique which is capable of reducing optical input power dependency of an optimal set threshold in a threshold setting limiter amplification circuit and performing good signal identification recovery with a specified set threshold by clipping output amplitude of a preamplifier in an optical receiving device, particularly a signal of "1" level at the time of input of a large signal.

With the above configuration, the present invention has the advantage that it is possible to achieve good signal identification recovery without requiring a troublesome threshold control or voltage control using a programmable control IC or the like for a peripheral circuit even at the time of input of a signal with large optical power, and it is possible to achieve good signal identification recovery by clipping amplitude of a high level.

The present invention has been described in detail above with reference to a number of exemplary embodiments. However, the invention is not limited to the example of the described embodiments. It will be apparent to those skilled in the art that these embodiments may be modified and altered in various ways without departing from the spirit and scope of the invention as defined by the appended claims.

What is claimed is:

1. A preamplifier, comprising:
   a single-ended amplifier which converts an input current signal into a voltage signal, and outputs an amplified voltage signal according to a preset amplification gain;
   a differential amplifier which includes first and second differential inputs, and which outputs a negative-phase signal and a positive-phase signal, wherein the amplified voltage signal is applied to the first differential input of the differential amplifier;
   an operational amplifier which includes first and second inputs which respectively receive the negative-phase signal and the positive-phase signal, wherein an output of the operational amplifier is applied to the second differential input of the differential amplifier; and
   a clipping circuit that clips an amplitude of the negative-phase signal output by the differential amplifier,
   wherein the clipping circuit includes a diode connected between positive power terminal and a signal line transmitting the negative-phase signal, wherein an anode of the diode is connected to the positive power terminal.

2. The preamplifier according to claim 1, wherein the signal line is a negative-phase signal output terminal of the differential amplifier.

3. A preamplifier, comprising:
   a single-ended amplifier which converts an input current signal into a voltage signal, and outputs an amplified voltage signal according to a preset amplification gain;
   a differential amplifier which includes first and second differential inputs, and which outputs a negative-phase signal and a positive-phase signal, wherein the amplified voltage signal is applied to the first differential input of the differential amplifier;

an operational amplifier which includes first and second inputs which respectively receive the negative-phase signal and the positive-phase signal, wherein an output of the operational amplifier is applied to the second differential input of the differential amplifier; and a clipping circuit that clips an amplitude of the negative-phase signal output by the differential amplifier, wherein the clipping circuit is a diode connected between a signal line transmitting the positive-phase signal and a negative power terminal, wherein a cathode of the diode is connected to the negative power terminal.

4. The preamplifier according to claim 3, wherein the signal line is a positive-phase signal output terminal of the differential amplifier.

5. A preamplifier, comprising:

a single-ended amplifier which converts an input current signal into a voltage signal, and outputs an amplified voltage signal according to a preset amplification gain;

a differential amplifier which includes first and second differential inputs, and which outputs a negative-phase signal and a positive-phase signal, wherein the amplified voltage signal is applied to the first differential input of the differential amplifier;

an operational amplifier which includes first and second inputs which respectively receive the negative-phase signal and the positive-phase signal, wherein an output of the operational amplifier is applied to the second differential input of the differential amplifier; and a clipping circuit that clips an amplitude of the negative-phase signal output by the differential amplifier, wherein the clipping circuit is an output offset generating circuit interposed between an input of the operational amplifier and a positive-phase signal output terminal and a negative-phase signal output terminal of the differential amplifier, and wherein the output offset generating circuit offsets the positive-phase signal such that a DC voltage of the positive-phase signal is higher than that of the negative-phase signal prior to being input to the operational amplifier.

6. The preamplifier according to claim 5, wherein the output offset generating circuit includes a number of positive-phase side diode stages and a different number of negative-phase side diode stages.

7. The preamplifier according to claim 5, wherein the output offset generating circuit includes a positive-phase side voltage dividing resistance that is different than a negative-phase voltage dividing resistance.

8. The preamplifier according to claim 5, wherein the output offset generating circuit is configured to apply an external voltage to the negative-phase signal.

9. An optical receiving device including a light receiving element that converts a received optical signal into a current signal, and a preamplifier that converts the current signal outputted from the light receiving element into an amplified output voltage signal, wherein the preamplifier comprises:

a single-ended amplifier which converts the current signal into a voltage signal, and outputs an amplified voltage signal according to a preset amplification gain;

a differential amplifier which includes first and second differential inputs, and which outputs a negative-phase signal and a positive-phase signal, wherein the amplified voltage signal is applied to the first differential input of the differential amplifier;

an operational amplifier which includes first and second inputs which respectively receive the negative-phase signal and the positive-phase signal, wherein an output of the operational amplifier is applied to the second differential input of the differential amplifier;

a clipping circuit that clips an amplitude of the negative-phase signal output by the differential amplifier;

a threshold setting limiter amplification circuit that determines a level of the amplified output voltage signal outputted from the preamplifier based on a preset threshold and outputs a determined level of the voltage signal; and a clock/data identification recovery circuit that recovers and outputs a clock signal and a data signal in synchronization with the clock signal from a signal outputted from the threshold setting limiter amplification circuit, wherein the clipping circuit includes a diode connected between positive power terminal and a signal line transmitting the negative-phase signal, wherein an anode of the diode is connected to the positive power terminal.

10. The optical receiving device according to claim 9, wherein the signal line is a negative-phase signal output terminal of the differential amplifier.

11. An optical receiving device including a light receiving element that converts a received optical signal into a current signal, and a preamplifier that converts the current signal outputted from the light receiving element into an amplified output voltage signal, wherein the preamplifier comprises:

a single-ended amplifier which converts the current signal into a voltage signal, and outputs an amplified voltage signal according to a preset amplification gain;

a differential amplifier which includes first and second differential inputs, and which outputs a negative-phase signal and a positive-phase signal, wherein the amplified voltage signal is applied to the first differential input of the differential amplifier;

an operational amplifier which includes first and second inputs which respectively receive the negative-phase signal and the positive-phase signal, wherein an output of the operational amplifier is applied to the second differential input of the differential amplifier;

a clipping circuit that clips an amplitude of the negative-phase signal output by the differential amplifier;

a threshold setting limiter amplification circuit that determines a level of the amplified output voltage signal outputted from the preamplifier based on a preset threshold and outputs a determined level of the voltage signal; and a clock/data identification recovery circuit that recovers and outputs a clock signal and a data signal in synchronization with the clock signal from a signal outputted from the threshold setting limiter amplification circuit, wherein the clipping circuit is a diode connected between a signal line transmitting the positive-phase signal and a negative power terminal, wherein a cathode of the diode is connected to the negative power terminal.

12. The preamplifier according to claim 11, wherein the signal line is a positive-phase signal output terminal of the differential amplifier.

13. An optical receiving device including a light receiving element that converts a received optical signal into a current signal, and a preamplifier that converts the current signal outputted from the light receiving element into an amplified output voltage signal, wherein the preamplifier comprises:

a single-ended amplifier which converts the current signal into a voltage signal, and outputs an amplified voltage signal according to a preset amplification gain;

a differential amplifier which includes first and second differential inputs, and which outputs a negative-phase signal and a positive-phase signal, wherein the amplified voltage signal is applied to the first differential input of the differential amplifier;

an operational amplifier which includes first and second inputs which respectively receive the negative-phase signal and the positive-phase signal, wherein an output of the operational amplifier is applied to the second differential input of the differential amplifier;

a clipping circuit that clips an amplitude of the negative-phase signal output by the differential amplifier;

a threshold setting limiter amplification circuit that determines a level of the amplified output voltage signal outputted from the preamplifier based on a preset threshold and outputs a determined level of the voltage signal; and a clock/data identification recovery circuit that recovers and outputs a clock signal and a data signal in synchronization with the clock signal from a signal outputted from the threshold setting limiter amplification circuit, wherein the clipping circuit is an output offset generating circuit interposed between an input of the operational amplifier and a positive-phase signal output terminal and a negative-phase signal output terminal of the differential amplifier, and wherein the output offset generating circuit offsets the positive-phase signal such that a magnitude of the positive-phase signal is higher than the negative-phase signal prior to being input to the operational amplifier.

14. The preamplifier according to claim 13, wherein the output offset generating circuit includes a number of positive-phase side diode stages and a different number of negative-phase side diode stages.

15. The preamplifier according to claim 13, wherein the output offset generating circuit includes a positive-phase side voltage dividing resistance that is different than a negative-phase voltage dividing resistance.

16. The preamplifier according to claim 13, wherein the output offset generating circuit is configured to apply an external voltage to the negative-phase signal.

* * * * *